United States Patent
Komeda et al.

(10) Patent No.: US 12,503,775 B2
(45) Date of Patent: Dec. 23, 2025

(54) COPPER ETCHING SOLUTION

(71) Applicant: C. Uyemura & Co., Ltd., Osaka (JP)

(72) Inventors: Takuya Komeda, Osaka (JP); Tetsuji Ishida, Osaka (JP); Hisamitsu Yamamoto, Osaka (JP); Kazunari Kato, Osaka (JP); Ryoyu Shimizu, Osaka (JP)

(73) Assignee: C. Uyemura & Co., Ltd., Osaka (JP)

( * ) Notice: Subject to any disclaimer, the term of this patent is extended or adjusted under 35 U.S.C. 154(b) by 0 days.

(21) Appl. No.: 17/727,003

(22) Filed: Apr. 22, 2022

(65) Prior Publication Data

US 2022/0389592 A1    Dec. 8, 2022

(30) Foreign Application Priority Data

Jun. 1, 2021    (JP) .................................. 2021-092590

(51) Int. Cl.
*C23F 1/18*    (2006.01)
(52) U.S. Cl.
CPC ...................................... *C23F 1/18* (2013.01)
(58) Field of Classification Search
CPC ................. C23F 1/18; C23F 1/34; C23F 1/44
USPC ........ 257/79.1–79.5; 216/105–108; 438/745, 438/754
See application file for complete search history.

(56) References Cited

U.S. PATENT DOCUMENTS

| 2014/0030896 A1* | 1/2014 | Kamimura | H01L 21/02063 |
| | | | 252/79.4 |
| 2020/0163219 A1* | 5/2020 | Kim | H05K 3/108 |

FOREIGN PATENT DOCUMENTS

| CN | 107227462 A | | 10/2017 | |
| JP | 2002-363777 A | | 7/2004 | |
| JP | 1505404 B | * | 3/2005 | ................ C23F 1/18 |
| JP | 5715088 | | 12/2013 | |
| JP | 2017-119915 A | | 7/2017 | |
| TW | 201522574 A | * | 6/2015 | ............... B08B 3/08 |
| TW | 2005068524 | * | 10/2015 | ....... H01L 21/67051 |
| WO | WO2006103751 A1 | | 10/2006 | |
| WO | WO2019013160 | | 5/2020 | |

OTHER PUBLICATIONS

DL-Proline, PubChem, (Year: 2004).*
Diethanolamine, Wikipedia (Year: 2013).*
Ethylenediamine (EDA), Dow (Year: 2023).*

* cited by examiner

*Primary Examiner* — Duy Vu N Deo
(74) *Attorney, Agent, or Firm* — Lee & Hayes, P.C.

(57) ABSTRACT

A copper etching solution contains an oxidizing agent and an amine compound. The oxidizing agent is one or more selected from the group consisting of a perchlorate, a chlorate, a chlorite, a hypochlorite, hydrogen peroxide, and a perborate, and the amine compound has one or more primary amino groups or secondary amino groups.

10 Claims, No Drawings

COPPER ETCHING SOLUTION

CROSS-REFERENCE TO RELATED APPLICATION

This application claims priority to Japanese Patent Application No. 2021-092590 filed on Jun. 1, 2021, the entire disclosure of which is incorporated by reference herein.

BACKGROUND

The present disclosure relates to a copper etching solution and a circuit board processing method using the same.

A wiring of a printed circuit board can be formed by a subtractive method or a semi-additive method, but the semi-additive method is preferable from the viewpoint of miniaturizing wiring. In a wiring formation step by the semi-additive method, a seed layer including an electroless copper plating layer having a thickness of about 0.5 μm to about 2 μm is formed on an insulation layer. Thereafter, a plating resist is formed on a surface of the seed layer, and a resist pattern is formed by exposure to light and development. Next, electrolytic copper plating and stripping of resist are performed, and finally, the seed layer is etched to form the wiring.

When the seed layer including the electroless copper plating layer is formed, as pretreatment steps, a cleaner step of imparting wettability to an insulating resin, a step of etching inner layer copper on the bottom of a via hole, and a step of applying a catalyst such as palladium for performing electroless copper plating are performed.

The inner layer copper is etched by 0.1 μm to 2 μm in order to remove an oxide and an organic substance of the inner layer copper and improve connection reliability with the electroless copper plating layer. A general copper etching solution includes a mixture of an oxidizing agent and an inorganic acid. As the oxidizing agent, sodium persulfate, hydrogen peroxide, or the like is used. As the inorganic acid, sulfuric acid, hydrochloric acid, nitric acid, or the like is used.

A copper layer in connection to the inner layer copper may be exposed at an end portion of the printed circuit board. When the printed circuit board is produced, a plurality of printed circuit boards is generally fixed to a stainless steel jig. For this reason, the copper layer exposed at the end portion of the printed circuit board in contact with the inner layer copper may come into contact with the stainless steel jig, thereby the inner layer copper and the jig may be in a conductive state.

When the inner layer copper is etched in such a state, the inner layer copper is largely excessively etched (galvanic corrosion). As a result, there are problems of causing deposition failure of electroless copper plating in a via hole and a through hole and deposition failure of electrolytic copper plating in an electrolytic copper plating step (void formation or insufficient via filling).

Galvanic corrosion of copper is caused not only in a state in which copper is in contact with the stainless steel jig, but also in a state of in which copper is in contact with a metal nobler than copper (a metal having a small ionization tendency), such as gold or silver. In Japanese Unexamined Patent Publication No. 2013-245401 (Patent Document 1) and WO 2019/013160 (Patent Document 2), a study on a copper etching solution has been conducted to solve such a problem.

SUMMARY

However, the copper etching solution described in Patent Document 1 does not have a sufficient effect of reducing galvanic corrosion. In addition, there is a need to keep a chlorine concentration in a range of 1 ppm to 20 ppm, and there is a problem in terms of handling.

The copper etching solution described in Patent Document 2 uses a large amount of ammonia water. There may deteriorate working environment. Further, there is a problem that an etching rate largely changes due to a change in the copper concentration.

An object of the present disclosure is to realize a copper etching solution which does not cause excessive etching of copper even in a state in which the object to be etched is in contact with a dissimilar metal.

In one aspect of a copper etching solution of the present disclosure, the copper etching solution contains one or more oxidizing agents selected from the group consisting of a perchlorate, a chlorate, a chlorite, a hypochlorite, hydrogen peroxide, and a perborate, and an amine compound having one or more primary amino groups or secondary amino groups. The copper etching solution containing a specific oxidizing agent and an amine compound having one or more primary amino groups or secondary amino groups is used, thereby an occurrence of excessive etching can be reduced even in a state in which copper that is the object of etching comes into contact with a dissimilar metal.

In one aspect of a copper etching solution, the amine compound can be one or more compounds selected from methylamine, ethylamine, ethylenediamine, triethylenetetramine, tetraethylenepentamine, diethylenetriamine, monoethanolamine, aniline, benzylamine, phenethylamine, anisidine, glycine, alanine, arginine, asparagine, glutamine, histidine, lysine, phenylalanine, and serine.

In one aspect of a copper etching solution, the amine compound can be one or more compounds selected from dimethylamine, diethylamine, diethanolamine, methylaniline, and proline.

In one aspect of a copper etching solution, pH of the etching solution can be 6 or more.

A circuit board processing method of the present disclosure includes etching a copper portion on a circuit board in connection to a dissimilar metal by using the copper etching solution of the present disclosure.

The copper etching solution of the present disclosure can keep excessive etching of copper from occurring even in a state in which copper that is the object to be etched is in contact with a dissimilar metal.

DETAILED DESCRIPTION

The copper etching solution of the present disclosure contains an oxidizing agent and an amine compound having a primary amino group or a secondary amino group, and can be less likely to cause excessive etching due to galvanic corrosion even in a state in which copper that is the object to be etched is in contact with a dissimilar metal.

The oxidizing agent is any one of a perchlorate, a chlorate, a chlorite, a hypochlorite, hydrogen peroxide, and a perborate. These may be used alone or in combination of two or more thereof. Specific examples thereof include sodium hypochlorite, sodium chlorite, sodium chlorate, sodium perchlorate, potassium hypochlorite, potassium chlorite, potassium chlorate, potassium perchlorate, hydrogen peroxide, sodium perborate, and potassium perborate. The condition for the concentration of the oxidizing agent may be appropriately determined, and is not particularly limited, but the concentration thereof is preferably 1 g/L or more, more preferably 2 g/L or more, and preferably 300 g/L or less, more preferably 100 g/L or less, still more preferably 30 g/L or less. When the concentration of the oxidizing agent is 1 g/L or more, copper can be sufficiently etched, and when the concentration thereof is 300 g/L or less, galvanic corrosion can be sufficiently reduced.

The amine compound is a compound having one or more primary amino groups or a compound having one or more secondary amino groups. The compound having both primary amino groups and secondary amino groups can also be used.

Specific examples of the amine compound having one or more primary amino groups include aliphatic amines such as methylamine, ethylamine, ethylenediamine, triethylenetetramine, tetraethylenepentamine, diethylenetriamine, and monoethanolamine; aromatic amines such as aniline, benzylamine, phenethylamine, and anisidine; and amino acids such as glycine, alanine, arginine, asparagine, glutamine, histidine, lysine, phenylalanine, and serine.

Specific examples of the amine compound having one or more secondary amino groups include aliphatic amines such as dimethylamine, diethylamine, and diethanolamine; aromatic amines such as methylaniline; and amino acids such as proline.

These amine compounds may be used alone or in combination of two or more thereof.

The concentration of the amine compound having one or more primary amino groups or secondary amino groups is not particularly limited, but is preferably 0.1 g/L or more, more preferably 1 g/L or more, even more preferably 5 g/L or more, and preferably 300 g/L or less, more preferably 150 g/L or less, even more preferably 80 g/L or less. When the concentration of the amine compound having one or more primary amino groups or secondary amino groups is 0.1 g/L or more, galvanic corrosion can be reduced, and when the concentration thereof is 300 g/L or less, a cost increase can be reduced.

The pH of the copper etching solution is preferably 6 or more. When the pH is 6 or more, corrosion of nickel and the like can also be sufficiently reduced. A pH-adjusting agent such as sodium hydroxide, potassium hydroxide, ammonia, sodium carbonate, hydrochloric acid, nitric acid, sulfuric acid, and phosphoric acid can be added to adjust the pH.

If necessary, components other than the above-described components may be added to the etching solution of the present disclosure. For example, a nonionic surfactant or a water-soluble solvent can be added in order to improve the permeability of the etching solution. Further, an organic acid such as ethylenediaminetetraacetic acid, citric acid, malic acid, tartaric acid, or gluconic acid may be added in order to support the chelating of copper.

The temperature at which the etching solution is used is not particularly limited, but is preferably 10° C. to 70° C. from the viewpoints of etching rate, etching unevenness, cost, and the like.

The contact time between the object to be etched and the etching solution can be appropriately selected in accordance with the required etching amount of copper.

For the method of contact between the copper that is the object to be etched and the etching solution, means such as dipping or spraying can be appropriately selected.

The copper etching solution of the present disclosure hardly causes excessive etching of copper due to galvanic corrosion even in a state in which a dissimilar metal such as stainless steel, silver, or gold is in contact with the object to be etched. For this reason, when the printed wiring circuit board is fixed to a jig or the like, there is no need to confirm if there is no conduction between a copper portion that is the object to be etched and the jig or the like, and production efficiency can be greatly improved and an occurrence of defects can also be reduced. In addition, even in a state in which a dissimilar metal such as silver or gold is in contact with a portion conducted to the copper portion that is the object to be etched, excessive etching does not occur, and thus the degree of freedom of a manufacturing process of the printed wiring circuit board can be greatly improved. Further, when the pH is 6.0 or more, the corrosion of nickel can also be reduced; therefore, it can be used in applications of which the corrosion of nickel is a problem.

EXAMPLES

Hereinafter, the present disclosure will be specifically described based on Examples. The following Examples are illustrative and are not intended to limit the present disclosure.

<Evaluation of Galvanic Corrosion>

A copper test piece and a dissimilar metal contact test piece including the copper in contact with a dissimilar metal were each etched, and a difference in etching amount between both were determined. A case where the difference in etching amount of 10% or less was evaluated as good (A), a case where the difference in etching amount of more than 10% and 20% or less was evaluated as acceptable (A), and a case where the difference in etching amount of more than 20% was evaluated as poor (B).

A copper clad laminate (MCL-E-67, manufactured by Showa Denko Materials Co., Ltd.) having a copper foil thickness of 18 μm, cut into a size of 50 mm×50 mm, was used as a copper test piece. A copper test piece subjected to displacement gold plating according to the steps shown in Table 1 was used as a dissimilar metal piece. The resultant obtained by connecting the copper test piece and the dissimilar metal piece with a stainless steel jig to conduct between copper and gold was used as a dissimilar metal contact test piece. Each of the copper test piece and the dissimilar metal contact test piece was subjected to the etching step shown in Table 2, and the etching amount of copper was determined by the following equation (1) from the difference in mass before and after the step. Further, the variation in the etching amount (hereinafter referred to as the etching amount variation) was obtained by the following formula (2).

$$\text{Etching amount (μm)} = (\text{weight (g) of test piece before step} - \text{weight (g) of test piece after step}) \times 22.4 \qquad (1)$$

$$\text{Etching amount variation (\%)} = |(\text{etching amount (μm) of dissimilar metal contact test piece} - \text{etching amount (μm) of copper test piece})/\text{etching amount (μm) of copper test piece}| \times 100 \qquad (2)$$

<Evaluation of Nickel Corrosion>

The copper test piece was subjected to the steps up to the electroless nickel plating shown in Table 1. The resultant was used as a nickel test piece. The nickel test piece was subjected to the etching step shown in Table 2, and a nickel-plated surface of the nickel test piece before and after the etching treatment was observed for the presence or absence of a change in surface shape by an SEM to evaluate nickel corrosion. A case where no change was observed in the surface shape of the nickel-plated surface before and after the etching treatment was evaluated as nonoccurrence (A), and a case where a change was observed in the surface shape was evaluated as occurrence (B).

TABLE 1

| Step | Temperature (° C.) | Time (min) |
| --- | --- | --- |
| Cleaning | 50 | 5 |
| Hot-water washing | 40 | 1 |
| Water washing | R.T. | 1 |
| Etching (Sodium persulfate: 100 g/L) | 25 | 1 |
| Water washing | R.T. | 1 |
| Acid cleaning (Sulfuric acid: 100 g/L) | 25 | 1 |
| Water washing | R.T. | 1 |
| Predipping (Sulfuric acid: 30 g/L) | 25 | 1 |
| Activating | 30 | 2 |
| Water washing | R.T. | 1 |
| Electroless nickel plating | 80 | 35 |
| Water washing | R.T. | 1 |
| Electroless palladium plating | 50 | 3 |
| Water washing | R.T. | 1 |
| Displacement gold plating | 80 | 13 |
| Water washing | R.T. | 1 |
| Drying | 60 | 20 |

TABLE 2

| Step | Temperature (° C.) | Time (min) |
| --- | --- | --- |
| Cleaning | 40 | 5 |
| Hot-water washing | 40 | 1 |
| Water washing | R.T. | 1 |
| Etching | Tables 3 to 5 | |
| Water washing | R.T. | 1 |
| Acid cleaning (Sulfuric acid: 100 g/L) | 25 | 1 |
| Water washing | R.T. | 1 |
| Drying | 60 | 20 |

Example 1

Sodium chlorite was used as an oxidizing agent, and triethylenetetramine was used as an amine compound. In the etching solution, the concentration of sodium chlorite was 24 g/L, and the concentration of triethylenetetramine was 11 g/L. Sodium hydroxide was added as a pH-adjusting agent so as to be 2 g/L to adjust the pH to 12.5. The temperature of the etching treatment was 25° C., and the immersion time was 3 minutes.

The etching amount of the copper test piece was 0.327 µm, the etching amount of the dissimilar metal contact test piece was 0.309 µm, the etching amount variation was 5.5%, and the result of the evaluation of galvanic corrosion was good. Further, no change in the shape of the nickel surface was observed.

Example 2

Hydrogen peroxide was used as an oxidizing agent, and triethylenetetramine was used as an amine compound. In the etching solution, the concentration of hydrogen peroxide was 14 g/L, and the concentration of triethylenetetramine was 11 g/L. The pH of the etching solution was 10.2. The temperature of the etching treatment was 25° C., and the immersion time was 3 minutes.

The etching amount of the copper test piece was 0.372 µm, the etching amount of the dissimilar metal contact test piece was 0.347 µm, the etching amount variation was 6.7%, and the result of the evaluation of galvanic corrosion was good. No change in the shape of the nickel surface was observed.

Example 3

Hydrogen peroxide was used as an oxidizing agent, and ethylenediamine was used as an amine compound. In the etching solution, the concentration of hydrogen peroxide was 19 g/L, and the concentration of ethylenediamine was 20 g/L. The pH of the etching solution was 6.0. The temperature of the etching treatment was 30° C., and the immersion time was 3 minutes.

The etching amount of the copper test piece was 2.00 µm, the etching amount of the dissimilar metal contact test piece was 1.96 µm, the etching amount variation was 2.0%, and the result of evaluation of galvanic corrosion was good. No change in the shape of the nickel surface was observed.

Example 4

Sodium perborate was used as an oxidizing agent, and triethylenetetramine was used as an amine compound. In the etching solution, the concentration of sodium perborate was 10 g/L, and the concentration of triethylenetetramine was 11 g/L. The pH of the etching solution was 10.9. The temperature of the etching treatment was 25° C., and the immersion time was 3 minutes.

The etching amount of the copper test piece was 0.309 µm, the etching amount of the dissimilar metal contact test piece was 0.338 µm, the etching amount variation was 9.4%, and the result of the evaluation of galvanic corrosion was good. No change in the shape of the nickel surface was observed.

Example 5

Sodium chlorite was used as an oxidizing agent, and ethylenediamine was used as an amine compound. In the etching solution, the concentration of sodium chlorite was 2.4 g/L, and the concentration of ethylenediamine was 6 g/L. The pH of the etching solution was 11.6. The temperature of the etching treatment was 25° C., and the immersion time was 3 minutes.

The etching amount of the copper test piece was 0.365 µm, the etching amount of the dissimilar metal contact test piece was 0.329 µm, the etching amount variation was 9.9%, and the result of the evaluation of galvanic corrosion was good. No change in the shape of the nickel surface was observed.

Example 6

Sodium chlorite was used as an oxidizing agent, and diethylenetriamine was used as an amine compound. In the etching solution, the concentration of sodium chlorite was 2.4 g/L, and the concentration of diethylenetriamine was 8 g/L. The pH of the etching solution was 11.4. The temperature of the etching treatment was 25° C., and the immersion time was 3 minutes.

The etching amount of the copper test piece was 0.450 µm, the etching amount of the dissimilar metal contact test piece was 0.421 µm, the etching amount variation was 6.4%, and the result of the evaluation of galvanic corrosion was good. No change in the shape of the nickel surface was observed.

Example 7

Sodium chlorite was used as an oxidizing agent, and monoethanolamine was used as an amine compound. In the etching solution, the concentration of sodium chlorite was 24 g/L, and the concentration of monoethanolamine was 30 g/L. Sodium hydroxide was added as a pH-adjusting agent so as to be 105 g/L so that the pH of the etching solution exceeded 13. The temperature of the etching treatment was 40° C., and the immersion time was 10 minutes.

The etching amount of the copper test piece was 0.293 μm, the etching amount of the dissimilar metal contact test piece was 0.332 μm, the etching amount variation was 13.3%, and the result of the evaluation of galvanic corrosion was within an acceptable range. No change in the shape of the nickel surface was observed.

Example 8

Sodium chlorite was used as an oxidizing agent, and tetraethylenepentamine was used as an amine compound. In the etching solution, the concentration of sodium chlorite was 24 g/L, and the concentration of tetraethylenepentamine was 14 g/L. The pH of the etching solution was 11.5. The temperature of the etching treatment was 25° C., and the immersion time was 10 minutes.

The etching amount of the copper test piece was 0.208 μm, the etching amount of the dissimilar metal contact test piece was 0.193 μm, the etching amount variation was 7.2%, and the result of the evaluation of galvanic corrosion was good. No change in the shape of the nickel surface was observed.

Example 9

Sodium chlorite was used as an oxidizing agent, and glycine was used as an amine compound. In the etching solution, the concentration of sodium chlorite was 2.4 g/L, and the concentration of glycine was 6 g/L. The pH of the etching solution was 7.2. The temperature of the etching treatment was 25° C., and the immersion time was 3 minutes.

The etching amount of the copper test piece was 0.316 μm, the etching amount of the dissimilar metal contact test piece was 0.338 μm, the etching amount variation was 7.0%, and the result of the evaluation of galvanic corrosion was good. No change in the shape of the nickel surface was observed.

Example 10

Sodium chlorite was used as an oxidizing agent, and diethanolamine was used as an amine compound. In the etching solution, the concentration of sodium chlorite was 24 g/L, and the concentration of diethanolamine was 60 g/L. Sodium hydroxide was added as a pH-adjusting agent so as to be 105 g/L so that the pH of the etching solution exceeded 13. The temperature of the etching treatment was 40° C., and the immersion time was 10 minutes.

The etching amount of the copper test piece was 0.309 μm, the etching amount of the dissimilar metal contact test piece was 0.340 μm, the etching amount variation was 10.0%, and the result of the evaluation of galvanic corrosion was good. No change in the shape of the nickel surface was observed.

Example 11

Hydrogen peroxide was used as an oxidizing agent, and ethylenediamine was used as an amine compound. In the etching solution, the concentration of hydrogen peroxide was 19 g/L, and the concentration of ethylenediamine was 20 g/L. The pH of the etching solution was 5.5. The temperature of the etching treatment was 30° C., and the immersion time was 3 minutes.

The etching amount of the copper test piece was 2.30 μm, the etching amount of the dissimilar metal contact test piece was 2.13 μm, the etching amount variation was 7.4%, and the result of the evaluation of galvanic corrosion was good. A change in the shape of the nickel surface was observed.

Comparative Example 1

Sodium chlorite was used as the oxidizing agent, and no amine compound was added. In the etching solution, the concentration of sodium chlorite was 24 g/L. Sodium hydroxide was added as a pH-adjusting agent so as to be 105 g/L so that the pH of the etching solution exceeded 13. The temperature of the etching treatment was 25° C., and the immersion time was 3 minutes.

The etching amount of the copper test piece was 0.027 μm, the etching amount of the dissimilar metal contact test piece was 0.152 μm, the etching amount variation was 463%, and the result of the evaluation of galvanic corrosion was poor. No change in the shape of the nickel surface was observed.

Comparative Example 2

Ammonium persulfate was used as an oxidizing agent, and triethylenetetramine was used as an amine compound. In the etching solution, the concentration of ammonium persulfate was 30 g/L, and the concentration of triethylenetetramine was 11 g/L. The pH of the etching solution was 8.0. The temperature of the etching treatment was 25° C., and the immersion time was 3 minutes.

The etching amount of the copper test piece was 0.184 μm, the etching amount of the dissimilar metal contact test piece was 0.258 μm, the etching amount variation was 40.2%, and the result of the evaluation of galvanic corrosion was poor. No change in the shape of the nickel surface was observed.

Comparative Example 3

Sodium chlorite was used as an oxidizing agent, and triethanolamine having neither a primary amino group nor a secondary amino group was used as an amine compound. In the etching solution, the concentration of sodium chlorite was 24 g/L, and the concentration of triethanolamine was 5.5 g/L. Sodium hydroxide was added as a pH-adjusting agent so as to be 105 g/L so that the pH of the etching solution exceeded 13. The temperature of the etching treatment was 40° C., and the immersion time was 10 minutes.

The etching amount of the copper test piece was 0.146 μm, the etching amount of the dissimilar metal contact test piece was 0.515 μm, the etching amount variation was 253%, and the result of the evaluation of galvanic corrosion was poor. No change in the shape of the nickel surface was observed.

Tables 3 to 5 collectively show the conditions and results for Examples and Comparative Examples.

TABLE 3

|  |  | Examples | | | |
| --- | --- | --- | --- | --- | --- |
|  |  | 1 | 2 | 3 | 4 |
| Oxidizing agent (g/L) | Sodium chlorite | 24 | | | |
|  | Hydrogen peroxide | | 14 | 19 | |
|  | Sodium perborate | | | | 10 |
|  | Ammonium persulfate | | | | |
| Amine compound (g/L) | Ethylenediamine | | | 20 | |
|  | Diethylenetriamine | | | | |
|  | Monoethanolamine | | | | |
|  | Triethylenetetramine | 11 | 11 | | 11 |
|  | Tetraethylenepentamine | | | | |
|  | Glycine | | | | |
|  | Diethanolamine | | | | |
|  | Triethanolamine | | | | |
| pH-adjusting agent (NaOH: g/L) | | 2 | | | |
| pH | | 12.5 | 10.2 | 6.0 | 10.9 |
| Treatment temperature (° C.) | | 25 | 25 | 30 | 25 |
| Immersion time (min) | | 3 | 3 | 3 | 3 |
| Etching amount (μm) | Copper test piece | 0.327 | 0.372 | 2.00 | 0.309 |
|  | Dissimilar metal contact test piece | 0.309 | 0.347 | 1.96 | 0.338 |
| Etching amount variation (%) | | 5.5 | 6.7 | 2.0 | 9.4 |
| Galvanic corrosion | | A | A | A | A |
| Nickel corrosion | | A | A | A | A |

TABLE 4

|  |  | Examples | | | | | | |
| --- | --- | --- | --- | --- | --- | --- | --- | --- |
|  |  | 5 | 6 | 7 | 8 | 9 | 10 | 11 |
| Oxidizing agent (g/L) | Sodium chlorite | 2.4 | 2.4 | 24 | 24 | 2.4 | 24 | |
|  | Hydrogen peroxide | | | | | | | 19 |
|  | Sodium perborate | | | | | | | |
|  | Ammonium persulfate | | | | | | | |
| Amine compound (g/L) | Ethylenediamine | 6 | | | | | | 20 |
|  | Diethylenetriamine | | 8 | | | | | |
|  | Monoethanolamine | | | 30 | | | | |
|  | Triethylenetetramine | | | | | | | |
|  | Tetraethylenepentamine | | | | 14 | | | |
|  | Glycine | | | | | 6 | | |
|  | Diethanolamine | | | | | | 60 | |
|  | Triethanolamine | | | | | | | |
| pH-adjusting agent (NaOH: g/L) | | | | 105 | | | 105 | |
| pH | | 11.6 | 11.4 | >13 | 11.5 | 7.2 | >13 | 5.5 |
| Treatment temperature (° C.) | | 25 | 25 | 40 | 25 | 25 | 40 | 30 |
| Immersion time (min) | | 3 | 3 | 10 | 10 | 3 | 10 | 3 |
| Etching amount (μm) | Copper test piece | 0.365 | 0.45 | 0.293 | 0.208 | 0.316 | 0.309 | 2.30 |
|  | Dissimilar metal contact test piece | 0.329 | 0.421 | 0.332 | 0.193 | 0.338 | 0.34 | 2.13 |
| Etching amount variation (%) | | 9.9 | 6.4 | 13.3 | 7.2 | 7.0 | 10.0 | 7.4 |
| Galvanic corrosion | | A | A | A⁻ | A | A | A | A |
| Nickel corrosion | | A | A | A | A | A | A | B |

TABLE 5

|  |  | Comparative Examples | | |
| --- | --- | --- | --- | --- |
|  |  | 1 | 2 | 3 |
| Oxidizing agent (g/L) | Sodium chlorite | 24 | | 24 |
|  | Hydrogen peroxide | | | |
|  | Sodium perborate | | | |
|  | Ammonium persulfate | | 30 | |
| Amine compound (g/L) | Ethylenediamine | | | |
|  | Diethylenetriamine | | | |
|  | Monoethanolamine | | | |
|  | Triethylenetetramine | | 11 | |
|  | Tetraethylenepentamine | | | |
|  | Glycine | | | |
|  | Diethanolamine | | | |
|  | Triethanolamine | | | 5.5 |
| pH-adjusting agent (NaOH: g/L) | | 105 | | 105 |
| pH | | >13 | 8 | >13 |
| Treatment temperature (° C.) | | 25 | 25 | 40 |
| Immersion time (min) | | 3 | 3 | 10 |
| Etching amount (μm) | Copper test piece | 0.027 | 0.184 | 0.146 |
|  | Dissimilar metal contact test piece | 0.152 | 0.258 | 0.515 |
| Etching amount variation (%) | | 463 | 40.2 | 253 |
| Galvanic corrosion | | B | B | B |
| Nickel corrosion | | A | A | A |

The copper etching solution of the present disclosure can keep copper from being excessively etched even in a state in which copper is in contact with a dissimilar metal, and is useful for forming a wiring or the like of a printed circuit board.

What is claimed is:

1. A circuit board processing method comprising etching a copper portion on a circuit board in connection to a dissimilar metal by using a copper etching solution, wherein the copper etching solution comprises:
   one or more oxidizing agents selected from the group consisting of a perchlorate, a chlorate, a chlorite, a hypochlorite, and a perborate; and
   an amine compound having one or more primary amino groups or secondary amino groups,
     the dissimilar metal is stainless steel, silver, and/or gold, and
     the dissimilar metal is in contact with a surface portion of the circuit board conducted to the copper portion and is in contact with the copper etching solution,
   wherein an etching rate of the copper is from 0.0208 μm/min to less than 0.2 um/min, the etching rate is represented by a formula of etching amount (μm)/immersion time (min).

2. The circuit board processing method of claim 1, wherein the amine compound is one or more compounds selected from methylamine, ethylamine, ethylenediamine, triethylenetetramine, tetraethylenepentamine, diethylenetriamine, monoethanolamine, aniline, benzylamine, phenethylamine, anisidine, glycine, alanine, arginine, asparagine, glutamine, histidine, lysine, phenylalanine, and serine.

3. The circuit board processing method of claim 1, wherein the amine compound is one or more compounds selected from dimethylamine, diethylamine, diethanolamine, methylaniline, and proline.

4. The circuit board processing method of claim 1, wherein the copper etching solution has a pH of 6 or more.

5. The circuit board processing method of claim 1, wherein a variation of an etching amount compared to an etching amount when the copper portion is not in connection to the dissimilar metal is 10% or less.

6. The circuit board processing method of claim 1, wherein
the circuit board is held by a jig and is immersed in the copper etching solution, and
the dissimilar metal is a part of the jig.

7. The circuit board processing method of claim 6, wherein the dissimilar metal includes stainless steel.

8. The circuit board processing method of claim 1, wherein
the circuit board has a via hole and/or through hole, and
the copper inner layer of the via hole and/or through hole is etched.

9. The circuit board processing method of claim 1, wherein
the dissimilar metal is contact with an end portion of the circuit board.

10. The circuit board processing method of claim 4, wherein
the circuit board has an exposed nickel portion on the surface of the circuit board, and
a corrosion of the exposed nickel portion is suppressed.

* * * * *